United States Patent [19]

Diener et al.

[11] Patent Number: 4,587,135
[45] Date of Patent: May 6, 1986

[54] PROCESS FOR PRODUCING METALLIC COATINGS

[75] Inventors: Arnulf Diener, Dortmund; Hans Kettler, Wissen; Ulrich Tenhaven, Dortmund, all of Fed. Rep. of Germany

[73] Assignee: Hoechst Aktiengesellschaft, Dortmund, Fed. Rep. of Germany

[21] Appl. No.: 669,310

[22] Filed: Nov. 7, 1984

[30] Foreign Application Priority Data

Nov. 11, 1983 [DE] Fed. Rep. of Germany ....... 3340840

[51] Int. Cl.$^4$ .............................................. B05D 3/06
[52] U.S. Cl. ........................................ 427/13; 427/34; 427/38
[58] Field of Search .............................. 427/34, 13, 38

[56] References Cited

U.S. PATENT DOCUMENTS 3,010,009 11/1961 Ducati .................................. 427/34

Primary Examiner—Bernard D. Pianalto
Attorney, Agent, or Firm—Mueller and Smith

[57] ABSTRACT

A process and apparatus for depositing a high-quality metallic coating on a steel strip. In this process, one or several metals or metal alloys are continuously evaporated in a thermal plasma from nonoxidizing gas and transformed into the highly ionized state of the thermal plasma. Subsequently, the metal ions contained in the plasma are electrostatically deposited on the steel strip at a pressure elevated by 100 Pa to 5000 Pa relative to the ambient pressure. During coating, the steel strip is held at a uniform temperature and coated at a rate of 40 m/min to 600 m/min.

7 Claims, 2 Drawing Figures

PROCESS FOR PRODUCING METALLIC COATINGS

The invention concerns a process for the continuous production of high-quality metallic coatings on steel strip, utilizing a plasma and a setup for the application of the process.

In addition to the coating of individual workpieces, coating cold-rolled steel strip with aluminum has attained technical significance and is applied for the manufacture of strapping band. In the process, aluminum is evaporated in a high vacuum of $10^{-4}$ torr and at 1400° C. by electron beam. The cold steel strip is passed across the aluminum crucible, causing the aluminum vapors to condense on the colder steel surface. The layer thickness of the deposition is proportional to vaporization time, compare "Herstellung von kaltgewalztem Band" (Production of Cold-Rolled Strip), Part 2, Verlag Stahleisen mbH, Düsseldorf, 1970, p. 231. A disadvantage of this prior method is that the vaporizing cone, contingent on the focal point of the electron beam and the free length of travel of the aluminum atoms, must be adapted to the strip width. Moreover, the condensation heat of the aluminum can be dissipated only through radiation and absorption by the steel strip. Thus, in order to avoid between aluminum and steel strip an alloying to $Fe_2Al_5$ and/or $FeAl_3$, a specific ratio must be given between the thickness of the steel strip and the amount of aluminum deposited.

Instead of evaporation by electron bombardment, metals can be evaporated in a high vacuum of $10^{-4}$ torr on heated tungsten or platinum wires, permitting the metal vapor to condense on workpieces under high vacuum (compare Rev. Sci. Instr. 2, 189, 1931). Such wires may also be substituted by directly or indirectly heated crucibles from such metals.

The disadvantages of such a coating process using nonionized metal vapor are, specifically, that the electron beam evaporation, just as the little effective evaporation processes by means of heating wire, heating crucible or corona discharge, requires a high vacuum or at least a partial vacuum, which considerably limits the suitability for steel strip coating or makes it very expensive. Especially maintaining a high vacuum of $10^{-4}$ torr requires sizable expense for the strip locks in air-to-air operation and for the vacuum pumps. Lastly, the methods described here will normally permit only the coating of one strip side, namely the underside of the horizontally advancing strip.

The U.S. Pat. No. 3,693,582 (3) teaches the vaporization of steel strip by high vacuum electron beam vaporization on both sides simultaneously. Here, two vapor supplies are arranged, and the strip passes vertically in between. Since due to the straightline propagation of the evaporated metal ions the yield is only a fraction of that possible with horizontal strip travel and one-sided vaporization, heated reflection screens are additionally provided which serve to statically charge the atoms and subsequently deflect them toward the strip being coated so as to increase the rate of deposition, i.e., the yield. But, because of the low effectiveness of such electrostatic charging, the effectiveness of such a setup lags behind that achievable with horizontal strip travel and one-sided deposition. All other disadvantages of high vacuum vaporization remain uncurtailed.

Consisting in the impossibility of introducing a steel strip at high speed in a high vacuum through locks without greatly disturbing the subsequent coating process through entrained oxygen and nitrogen, the essential drawback could be avoided by replacing the high vacuum process by one performed at normal pressure. But the state of the art offers no suitable suggestions to that effect. From the U.S. Pat. No. 4,223,047 (4) it is previously known to apply on a steel strip traveling at high speed, under normal pressure, an oil film which is electrostatically deposited from a pre-ionized oil mist. Employing air as carrier gas, this process is unsuited for metal coating from the outset because it multiplies the problems of oxygen and nitrogen migration into the working space. Besides, pre-ionization by electrostatic fields has the same disadvantage of low effectiveness that was discussed above in conjunction with the U.S Pat. No. 3,693,582 (3).

Another normal pressure process is described in the German patent document No. 838 846 (1). Preheated metals, specifically tin, are melted here and sprayed pneumatically, with the spray droplets being charged at a negative pole and guided electrostatically onto the substrate to be coated. Here, too, the presence of air precludes the application with metals having oxygen or nitrogen affinity. Besides, metal drops produce not always continuous coatings which are absolutely desirable especially in coating operations with aluminum and similar metals, if localized corrosion is to be avoided. Neither derives a suitable teaching from the U.S. Pat. No. 2,719,820 (2). It provides for electrolytically depositing in a multiple-step, very expensive and trouble-prone process, on a strip traveling at high speed, first a metal coating and then spraying on it a second metal coating, the spraying being performed in an electrostatic field where the droplets are electrostatically charged and guided onto the substrate. While the use of a nonoxidizing atmosphere is recommended, a uniformity of the coatings can hardly be guaranteed even with this electrostatically aided spray process. Therefore, the patent is limited to explicitly fluid and low-melting metals, such as lead, tin, zinc and similar, where the film formation is promoted through the mingling of the sprayed droplets.

Metal evaporation can also be performed under heat supply through a plasma burner at normal pressure, but a deposition of the nonionized metal atoms for obtaining a uniform layer is controllable only through the carrier gas flow and, therefore, unsuited for a uniform coating of large areas. Neither would coupling with a subsequent electrostatic charging, for instance in accordance with (3), produce a satisfactory result, due to the low effectiveness of such a charge.

Also known, from the German patent disclosure No. 32 06 622, is generating between an electrode and a metal strip an electric arc for vaporizing a metal coating on a substrate. To that end, the substrate is introduced in the direct path of the metal vapor in the vicinity of the electric arc.

Previously known from the European patent document No. 8634 is a process for depositing a metal or alloy layer on an electrically conductive workpiece through corona discharge, the workpiece being wired as an electrode of the electrical field and the carrier gas and the donor medium being pre-ionized and introduced in the electrical field in ionized condition, thus producing metal ions through low-pressure discharge ($10^{-2}$ mm Hg).

With another prior process, compare German patent disclosure No. 23 46 738, a wire is evaporated through a surge current discharge and the metal vapor is directed at the surface being coated, through application of a magnetic and/or electrical field.

Disadvantageous on the three latter methods is that a deposition can take place only where the plasma impinges directly on the substrate to be coated. Therefore, the geometric plasma formation must be adapated to the dimensions of the part being coated. Otherwise, an uncontrolled heat-up of the substrate, among other things, is inevitable and disadvantageous.

Suggested also, in many cases, is a low-pressure plasma. But when coating steel strip, any reaction of oxygen with the metal vapor in plasma condition, with the steel strip surface, and the applied metallic coating must be avoided at any rate. This cannot be realized in a low-pressure process when the steel strip passes continuously and at high speed through the coating chamber.

The latter processes are in their entirety such for coating individual workpieces and can thus not be reverted to for solving the inventional problem.

The problem underlying the invention is designing a process of the initially mentioned type in a way permitting a simple and continuous two-sided application of a high-quality coating on a steel strip running at high speed, where a close coating thickness tolerance both over the strip length and the strip width is accomplished also with relatively wide steel strips, preferably over 1000 mm wide, and where the process overall is easy to perform.

A further problem underlying the invention is performing in a simple manner and integrated with the coating process the cleaning which in such a coating process is absolutely necessary, removing oil and emulsion residues clinging to the steel strip surfaces to be coated, under avoidance of the usual and expensive wet, chemical cleaning methods.

The problem is inventionally solved by continuously evaporating in a first step one or several metals or metal alloys to a thermal plasma from nonoxidizing gas and transforming the vapor itself to the highly ionized state of the thermal plasma, while in a second step and at a pressure elevated by 100 Pa to 5000 Pa above ambient pressure electrostatically depositing the metal ions present in said plasma on the surface of the steel strip, holding the steel strip during coating at a uniform temperature, and coating it at the rate of 40 up to 600 m/min.

The two process steps, namely transforming the metal or metal alloy to the highly ionized state of the thermal plasma and depositing the metal ions contained in said plasma, are performed successively and locally separated.

The first process step is favorably conducted in the lower half of the chamber, the second process step in the center area of the chamber. Accomplished thereby is a local separation of transforming the coating metals to the highly ionized plasma state, for one, and of depositing the coating metal on the steel strip, for another, permitting thereby a control of the steel strip heating. But this local separation can be taken only to a point where a sufficient amount of depositable metal ions is still present, at the point of deposition, in the cooling plasma recombining by ion neutralization.

The cleaning of the steel strip surface necessary for obtaining well adhering coatings is inventionally accomplished by exposing the steel strip surface during the second process step, in a process section before the electrostatic coating, to a hot plasma and cleaning it thereby.

A favorable embodiment of a device for inventionally producing a metallic coating on steel strip is characterized in that in a chamber which is designed extensively gastight and provided with centrally arranged entrance and exit openings, for the steel strip which is to be and-/or has been coated, gas lines run on both sides of the entrance opening into the chamber, in that the gas lines are provided, inside the chamber, with generating devices for thermal plasma consisting of gas and metal ions, in that between these generating devices and the steel strip there are shielding plates provided, and in that in the center area of the chamber, spaced from the steel strip, there are electrically positively charged depositing plates arranged on both sides.

Further favorable embodiments and advancements of the inventional process and device derive from the following description and the patent claims.

The advantages of the inventional process and device, whereby the drawbacks of the state of the art are avoided, moreover, are constituted by the fact that the electrostatic deposition of the metal ions enables a good control of the layer thickness while permitting its adaptation to the strip width and the strip travel, by avoiding through pressurization of the chamber filled with a nonoxidizing gas in a simple manner an oxidation of the metal vapor, by enabling through control of the quantity share of various metals fed into the plasma, and at simultaneous deposition, alloys which with respect to conditions of equilibrium cannot be produced by smelting and, due to the ranking in the electrolytic voltage series of the metals, can often not be produced galvanically either, and in that, lastly, the suggested separation of producing metal ions from metals or metal alloys as component of a thermal plasma, in a first process step, and depositing the metal ions through an electrostatic field, in a second step, permits an optimal control of heating the strip to be coated.

When testing the described process on a pilot system it was found that sound metallic coatings can be achieved only when keeping any oxygen away. When using air as plasma gas, the treated steel strip oxidized heavily, and the formation of metallic coatings was not possible on the oxide layers that had formed. When extensively keeping the oxygen away by filling the treatment chamber with a nonoxidizing gas, such as argon, at a pressure corresponding with the pressure of the ambient air, though, an oxidation of the steel strip could be reduced to where metallic coatings would deposit. Yet this measure was still unable to prevent a slight oxidation of the steel strip. Obviously, this measure did not completely prevent the access of atmospheric oxygen at the points of strip entering and leaving. The deposited coatings displayed in this case insufficient adhesion.

Surprisingly, it was found though that firmly adhering coatings can be produced when maintaining in the treatment chamber a slightly elevated pressure of the nonoxidizing gas, of more than 100 Pa above the ambient pressure. In a pilot test, for instance, a constant pressure of 110 Pa relative to the ambient pressure was adjusted inside the treatment chamber. Under these conditions it was possible to produce firmly adhering metallic coatings on steel strip by application of the suggested process.

But is was found as well that the pressure of the nonoxidizing gas in the treatment chamber must not be set too high. At pressures over 5000 Pa the plasma flame becomes unstable and electric arc type discharges occur between the steel strip 1 and the depositing plates 8, causing damage to the steel strip.

Further examinations conducted on a pilot plant showed that firmly adhering metallic coatings can be produced on steel strip without electrical discharges and damage to the steel strip resulting thereof, at a nonoxidizing gas pressure ranging from 100 to 5000 Pa.

Examinations also showed that firmly adhering metallic coatings cannot be produced either when the steel strip surface is contaminated, for instance by grease or rolling emulsions.

But surprisingly it was found that in the inventional process these contaminations can be eliminated by briefly exposing the steel strip directly to the plasma flow. For instance, firmly adhering metal coatings were produced on steel strips whose surface was wetted with rolling emulsion, when in the framework of the second process step, prior to the actual coating, these steel strips were exposed for about 10 seconds to a thermal plasma. This plasma can be produced either through additional plasma generating devices or can be branched off the thermal plasma which is produced in the first process step and consists of inert gas and metal ions.

Preferred embodiments of devices for producing high-quality metallic coatings on steel strip are presented in the drawings.

DETAILED DESCRIPTION OF THE DRAWINGS

Figure 1:
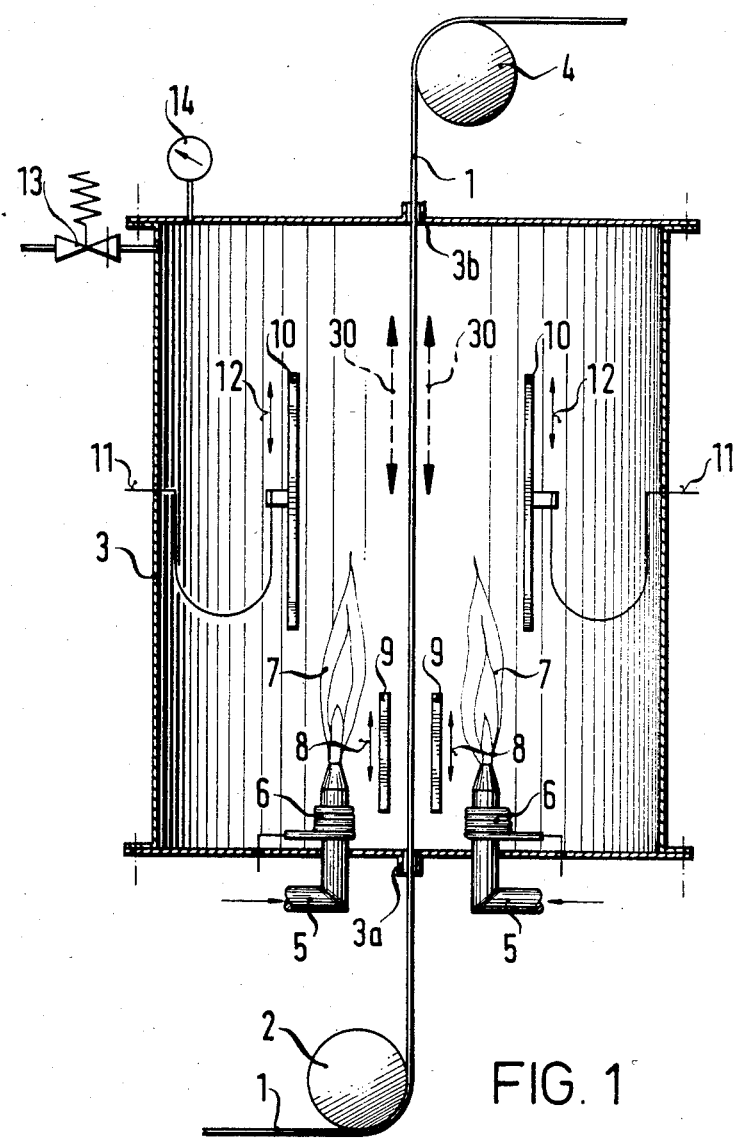
FIG. 1 shows a device for coating a previously cleaned (for instance annealed bright or pickled) steel strip, while FIG. 2 encompasses in the second process step a cleaning of the steel strip surface prior to coating by hot thermal plasma.

In detail, FIG. 1 shows the following:

The steel strip 1 to be coated, for instance cold-rolled strip, is introduced via a reversing roller 2 in a chamber 3 which through the entrance opening 3a has an extensively gastight design, and it exits upon coating on the opposite end of the chamber through the exit opening 3b and runs over another reversing roller 4, e.g., to a not illustrated take-up reel where it is coiled.

Through lines 5 arranged on both sides of the steel strip 1 entering the chamber 3, an inert or slightly reducing, i.e., nonoxidizing gas is fed into the chamber 3 at a pressure of preferably 500 Pa to about 1000 Pa relative to the environment. This nonoxidizing gas serves as carrier gas for the metals or metal alloys to be deposited and contains these in a finely distributed form. Preferred metals or metal alloys are aluminum, tin, zinc, chrome, nickel, copper and other alloys. By inductive or capacitive coupling of a high-frequency electrical field a thermal plasma 7 is produced from the gas, in which also the metals or metal alloys are ionized so as to become a component of the plasma. Similarly, the plasma can be produced also by an electric arc. Argon or a mixture of argon and hydrogen is preferably used as gas.

Provided between the steel strip 1 and the plasma 7 are shielding plates 9 which are shiftable in the direction of arrow 8, i.e., in the direction of strip travel, and in opposite direction, and by which a direct heat effect of the plasma 7 upon the steel strip 1 is avoided. Shifting these shielding plates 9 enables a control of the heat effect, making it possible to keep the steel strip 1 at a uniform temperature.

Arranged in the center area of the chamber 3, spaced from the steel strip 1 on both sides, are depositing plates 10 which relative to the steel strip carry a positive electrical charge and between which passes the steel strip 1. Positively charged, the metal ions from the plasma 7 travel thus toward the steel strip 7 and are deposited on its surface in the area 30.

The electrical charge on the depositing plates 10 is generated by means of a not illustrated high-voltage DC generator connected through lines 11 with the depositing plates 10.

An adaptation of the local separation currently required in view of varying steel strip thickness, varying coating metal, desired coating thickness and a desired or still permissible heating and heating rate of the steel strip, between the evaporation of the coating metal and its deposition on the surface, is accomplished in that the depositing plates 10 are shiftable in the direction of arrows 12. The deposition point 30 on the steel strip 1 can be optimally varied relative to the actual plasma 7.

Recombined and electrically neutral, the inert gas leaves the chamber 3 through a regulable gas relief valve 13. Near the point of gas exit and/or the valve 13 there is a pressure gauge 14 provided which, measuring the pressure of the gas inside the chamber 3, controls the opening and closing of the gas relief valve 13 in a way such that a given pressure of the nonoxidizing gas is maintained in the chamber 3. Nonoxidizing and/or inert gases being very expensive, the gas is upon leaving the chamber 3, facultatively after conditioning through removal of any absorbed oxygen, reintroduced in the gas lines 5 for reuse as plasma fuel gas.

Figure 2:
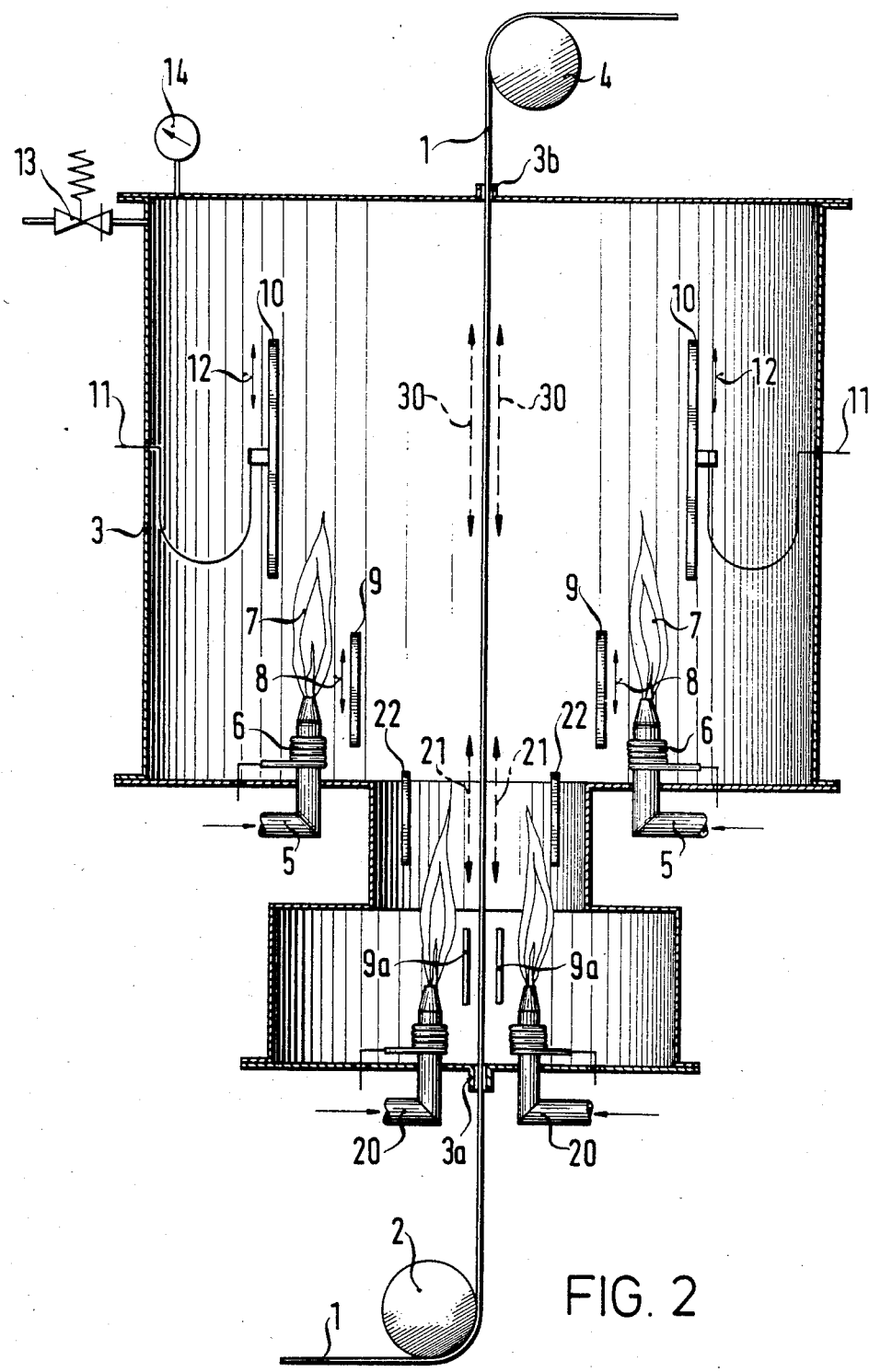

In FIG. 2, the same reference numbers apply as in FIG. 1, yet there are additional plasma generators 20 illustrated which produce thermal plasma. It impinges on the steel strip surface in the area 21, cleaning it effectively and thoroughly prior to coating. Additional electrostatic deflector plates 22 may uniformly distribute, across the strip width, the plasma flow intended for cleaning. The plates 22 may be identical with the shielding plates 8. But the inventional cleaning is possible also with the setup presented in FIG. 1, that is, without additional plasma generators 20, if the inert gas plasma is selectively so deflected by the electrically positively charged depositing plates 10 that it will reach the steel strip surface earlier than do the metal ions.

We claim:

1. Process for continuously producing high-quality metallic coatings on steel strip utilizing a plasma, comprising the following steps:
   (1) continuously evaporating one or several metals or metal alloys in a thermal plasma formed from nonoxidizing gas wherein said one or several metals or metal alloys are transformed into metal ions in the highly ionized state of the thermal plasma;
   (2) passing said metal ion-containing thermal plasma to a deposition area which is separated from the location of step (1); and
   (3) electrostatically depositing said metal ions onto the steel strip using an electrically-charged depositing plate which is in spaced-apart relationship from the steel strip, said depositing step being done at a pressure elevated by 100 Pa to 5,000 Pa above ambient pressure, the steel strip being held at a uniform temperature during said depositing step and being coated at the rate of between 40 m/min and 600 m/min.

2. Process according to claim 1, characterized in that the plasma from nonoxidizing gas and coating metal or coating metal alloy is produced by inductive coupling.

3. Process according to claim 1, characterized in that the plasma from nonoxidizing gas and coating metal or coating metal alloy is produced by capacitive coupling.

4. Process according to claim 1, characterized in that the plasma from nonoxidizing gas and coating metal or coating metal alloy is produced by electric arc.

5. Process according to claim 1, characterized in that in the framework of the second step the steel strip surface is exposed to a hot plasma and thus cleaned in a process section preceding the electrostatic coating.

6. Process according to claim 1, characterized in that the steel strip is coated at the rate of 60 m/min to 360 m/min.

7. Process according to claim 1, characterized in that the nonoxidizing gas is reused, facultatively after conditioning for removal of any oxygen absorbed.

* * * * *

UNITED STATES PATENT AND TRADEMARK OFFICE
CERTIFICATE OF CORRECTION

PATENT NO. : 4,587,135
DATED : May 6, 1986
INVENTOR(S) : Arnulf Diener, et al.

It is certified that error appears in the above—identified patent and that said Letters Patent is hereby corrected as shown below: Title page:

Assignee data: "Hoechst Aktiengesellschaft" should read --Hoesch Aktiengesellschaft--

Signed and Sealed this

Twenty-third Day of September 1986

[SEAL]

Attest:

DONALD J. QUIGG

Attesting Officer

Commissioner of Patents and Trademarks